United States Patent
Smith et al.

(10) Patent No.: US 7,266,732 B2
(45) Date of Patent: Sep. 4, 2007

(54) MRAM WITH CONTROLLER

(75) Inventors: Kenneth Smith, Boise, ID (US); Gadiel Seroussi, Cupertino, CA (US); Jonathan Jedwab, Vancouver (CA); James Davis, Richmond, VA (US); Kenneth Eldredge, Boise, ID (US)

(73) Assignee: Samsung Electronics Co., Ltd. (KR)

( * ) Notice: Subject to any disclaimer, the term of this patent is extended or adjusted under 35 U.S.C. 154(b) by 490 days.

(21) Appl. No.: 10/743,662

(22) Filed: Dec. 22, 2003

(65) Prior Publication Data

US 2005/0135165 A1 Jun. 23, 2005

(51) Int. Cl.
G06F 11/00 (2006.01)

(52) U.S. Cl. .................................................... 714/42
(58) Field of Classification Search .............. 714/42, 714/43, 52, 758, 784, 48, 764, 25, 31, 718
See application file for complete search history.

(56) References Cited

U.S. PATENT DOCUMENTS

| | | | | |
|---|---|---|---|---|
| 4,649,541 A * | 3/1987 | Lahmeyer | ................... | 714/784 |
| 5,602,987 A | 2/1997 | Harari et al. | | |
| 5,615,221 A * | 3/1997 | Karp et al. | ................... | 714/752 |
| 5,661,848 A * | 8/1997 | Bonke et al. | ................ | 711/112 |
| 5,872,800 A * | 2/1999 | Glover et al. | ................ | 714/766 |
| 6,426,893 B1 * | 7/2002 | Conley et al. | ......... | 365/185.11 |
| 6,762,930 B2 * | 7/2004 | Minne' | ....................... | 361/683 |
| 2003/0023924 A1 * | 1/2003 | Davis et al. | ................. | 714/763 |
| 2003/0133262 A1 * | 7/2003 | Minne' | ....................... | 361/684 |
| 2004/0111583 A1 * | 6/2004 | Han et al. | .................... | 711/203 |
| 2004/0255090 A1 * | 12/2004 | Guterman et al. | ........... | 711/156 |
| 2005/0144551 A1 * | 6/2005 | Nahas | ........................ | 714/763 |

* cited by examiner

*Primary Examiner*—Nadeem Iqbal
(74) *Attorney, Agent, or Firm*—Myers Bigel Sibley & Sajovec PA

(57) ABSTRACT

A memory card comprising an magnetic random access memory (MRAM) array that comprises a plurality of magnetic memory cells and a controller coupled to the MRAM array. The controller is configured to communicate with a host device, and the controller is configured perform an error correction function associated with at least one of the plurality of magnetic memory cells.

24 Claims, 5 Drawing Sheets

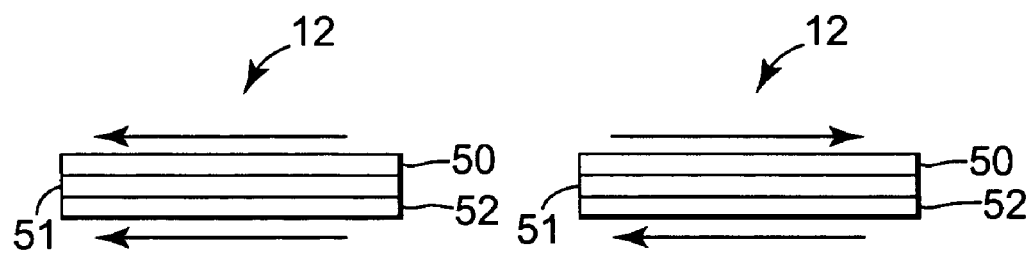
Fig. 2a  Fig. 2b
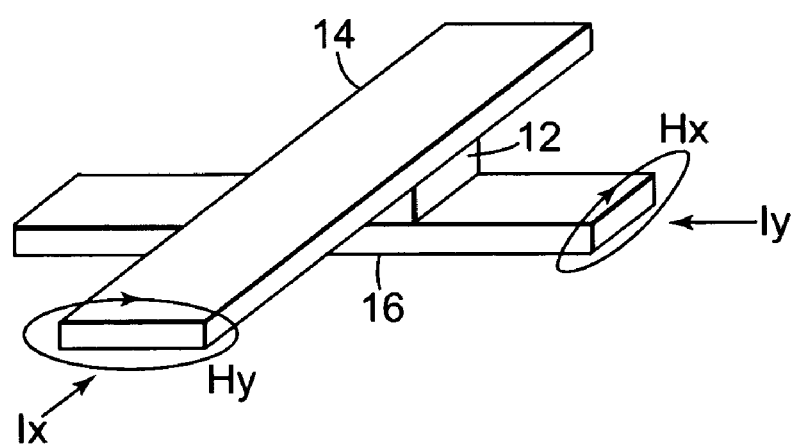
Fig. 3

MRAM WITH CONTROLLER

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A magnetic memory cell is usually written to a desired logic state by applying external magnetic fields that rotate the orientation of magnetization in its data storage layer. The logic state of a magnetic memory cell is indicated by its resistance which depends on the relative orientations of magnetization in its data storage and reference layers. The magnetization orientation of the magnetic memory cell assumes one of two stable orientations at any given time. These two stable orientations, parallel and anti-parallel, represent, for example, logic values of "0" and "1."

Typically, the orientation of magnetization in the data storage layer aligns along an axis of the data storage layer that is commonly referred to as its easy axis. The external magnetic fields are applied to flip the orientation of magnetization in the data storage layer along its easy axis to either a parallel or anti-parallel orientation. With parallel orientation, the magnetic memory cell is in a low resistance state because the orientation of magnetization in its data storage layer is substantially parallel along the easy axis. With anti-parallel orientation, the magnetic memory cell is in a high resistance state because the orientation of magnetization in its data storage layer is substantially anti-parallel along the easy axis.

A typical magnetic memory includes at least one array of magnetic memory cells. Word lines extend along rows of the magnetic memory cells, and bit lines extend along columns of the magnetic memory cells. Each magnetic memory cell is located at an intersection of a word line and a bit line. A selected magnetic memory cell is usually written by applying electrical currents to the particular word and bit lines that intersect at the selected magnetic memory cell.

MRAM may offer speed advantages over other types of memory devices. As a result, MRAM may provide increased performance to host devices that use them. For MRAM to increase the performance of a host device, however, MRAM needs to be able to reliably store and retrieve information. Unfortunately, magnetic memory cells in MRAMs often suffer from defects that lead to errors in storing and retrieving information from the cells. It would be desirable to be able to utilize the increased speed of MRAM memory devices while ensuring their storage reliability.

SUMMARY OF THE INVENTION

One exemplary embodiment of the present disclosure provides a memory card comprising a magnetic random access memory (MRAM) array that comprises a plurality of magnetic memory cells and a controller coupled to the MRAM array. The controller is configured to communicate with a host device, and the controller is configured perform an error correction function associated with at least one of the plurality of magnetic memory cells.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 2a is a diagram illustrating an embodiment of a parallel magnetization orientation of a magnetic memory cell.

FIG. 2b is a diagram illustrating an embodiment of an anti-parallel magnetization orientation of a magnetic memory cell.

FIG. 3 is a diagram illustrating an embodiment of a magnetic memory cell that has been selected during a write operation.

DETAILED DESCRIPTION

A memory card comprising a magnetic random access memory (MRAM) array that comprises a magnetic memory cells and a controller coupled to the MRAM array. The controller is configured to communicate with a host device, and the controller is configured to perform error correction functions associated with the magnetic memory cells.

Figure 1:
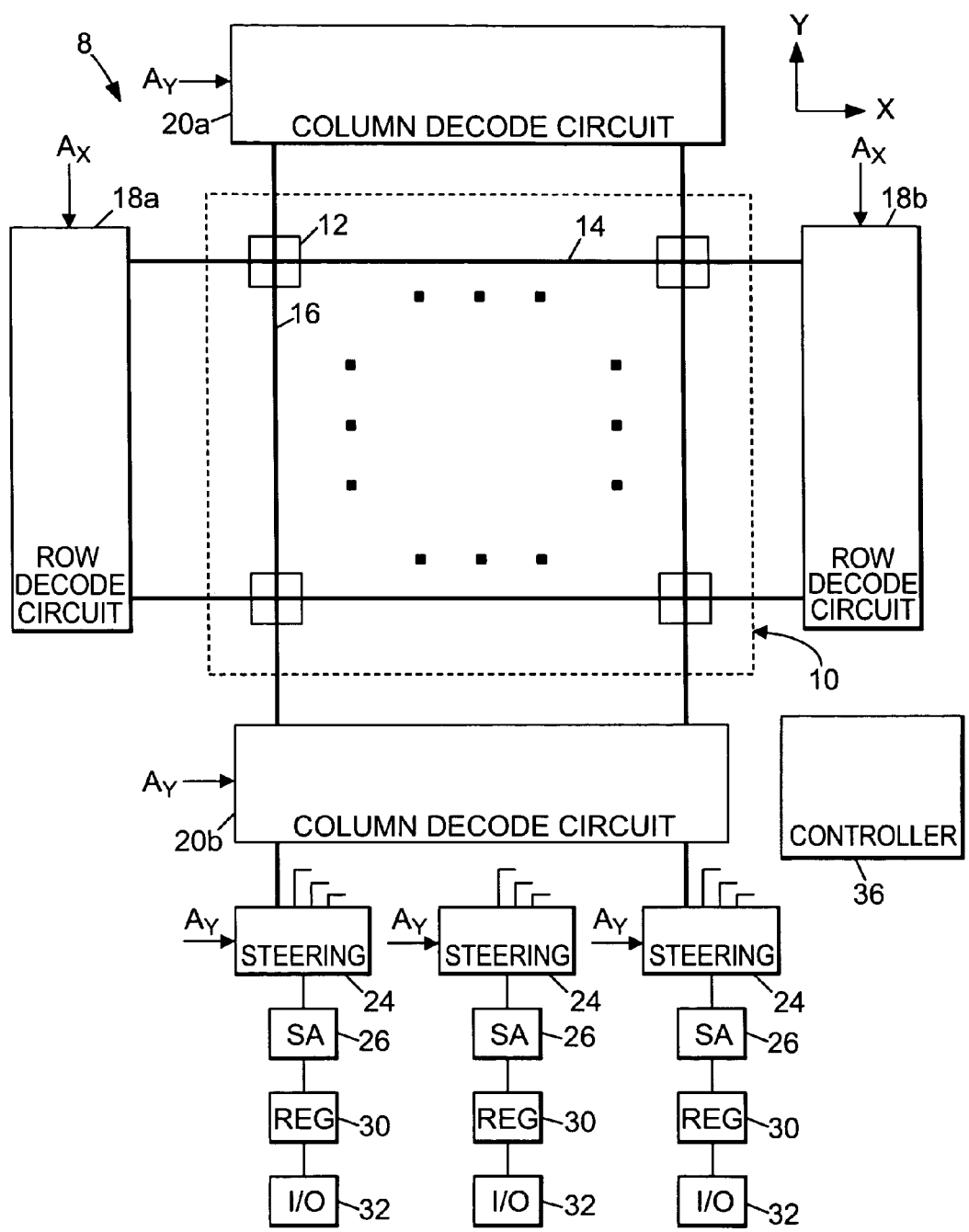
FIG. 1 is a diagram illustrating an embodiment of a data storage device that includes a cross point array of magnetic memory cells.

Reference is now made to FIG. 1, which illustrates an embodiment of an MRAM device 8 including a cross point array 10 of magnetic memory cells 12. Memory cells 12 are arranged in rows and columns, with the rows extending along an x-direction and the columns extending along a y-direction. Only a relatively small number of memory cells 12 are shown to simplify the description of the invention. In practice, arrays of any size may be used with any number of memory cells.

Traces functioning as word lines 14 extend along the x-direction in a plane on one side of array 10. Traces functioning as bit lines 16 extend along the y-direction in a plane on an opposite side of the memory cell array 10. Each memory cell 12 is located at a cross point of a corresponding word line 14 and bit line 16.

Memory cells 12 are not limited to any particular type of device. For example memory cells 12 may be spin dependent tunneling ("SDT") junction devices. In other embodiments, memory cells 12 may be anisotropic magnetoresistive devices, giant magnetoresistive devices, colossal magnetoresistive devices, extraordinary magnetoresistive devices, or very large magnetoresistive devices.

Referring now to FIGS. 2a and 2b, a typical SDT junction device includes a pinned layer 52 having a magnetization that is oriented in a plane of the pinned layer 52 but fixed so as not to rotate in the presence of an applied magnetic field in a range of interest. The SDT junction device also includes a "free" layer 50 having a magnetization orientation that is not pinned. Rather, the magnetization can be oriented in either of two directions along an axis (the "easy" axis) lying in the plane of the free layer 50. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b). The magnetization in the free layer 50 may be oriented by applying write currents to word and bit lines 14 and 16 that cross the memory cell.

The free and pinned layers 50 and 52 are separated by an insulating tunnel barrier 51. The insulating tunnel barrier 51 allows quantum mechanical tunneling to occur between the free and pinned layers 50 and 52. This tunneling phenomenon is electron spin dependent, making the resistance of the SDT junction device 12 a function of the relative orientations of the magnetization of the free and pinned layers 50 and 52. For instance, resistance of the SDT junction device is a first value R if the orientation of magnetization of the free and pinned layers 50 and 52 is parallel and a second value R+ΔR if the magnetization of orientation is anti-parallel.

Returning to FIG. 1, the MRAM device 8 also includes row decode circuits 18a and 18b and column decode circuits 20a and 20b. Row decode circuits 18a and 18b and column decode circuits 20a and 20b provide bi-directional currents on word lines 14 and bit lines 16 to cause memory cells 12 to be read from and written to. In other embodiments, there may separate write lines which run over the top of the read lines, in both rows and columns.

The MRAM device 8 further includes a read circuit, the sense amplifier for which is shown as 26, for sensing the resistance of selected memory cells during read operations and a write circuit (not shown) for orienting the magnetization of selected memory cells during write operations.

The read circuit includes a plurality of steering circuits 24 and detection circuits 26. Multiple bit lines 16 are connected to each steering circuit 24. Each steering circuit 24 includes a set of switches that connect a bit line 16 to sense amplifier 26. An output of the sense amplifier 26 is supplied to a data register 30, which, in turn, is coupled to an I/O pad 32 of the MRAM device 8. If the MRAM device 8 has multiple levels of memory cell arrays, then bit lines 16 and memory cell strings 12 from the additional levels may be multiplexed through steering element 24 into the detection circuits 26.

A controller 36 provides control signals to row decode circuits 18a and 18b, column decode circuits 20a and 20b, and steering circuits 24. Controller 36 also maintains the state of MRAM device 8.

FIG. 3 is a diagram illustrating an embodiment of a memory cell 12 that has been selected during a write operation. In one embodiment, the magnetization in free layer 50 of the selected memory cell 12 is oriented by supplying the currents $I_X$ and $I_Y$ to lines 14 and 16 which cross memory cell 12. Supplying the current $I_X$ to word line 14 causes a magnetic field $H_Y$ to form around conductor 14. Supplying the current $I_Y$ to bit line 16 causes a magnetic field $H_X$ to form around conductor 16. When sufficiently large currents $I_X$ and $I_Y$ are passed through word line 14 and bit line 16, the magnetic fields $H_X$ and $H_Y$ in the vicinity of free layer 50 cause the magnetization of free layer 50 to reverse from the parallel orientation to the anti-parallel orientation or the anti-parallel orientation to the parallel orientation. The currents $I_X$ and $I_Y$ are selected so that the combined magnetic fields $H_X$ and $H_Y$ are sufficient to rotate the orientation of free layer 50, but not too high so as to cause either pinned layer 52 or free layer 50 of other memory cells 12 to reverse their orientation.

Figure 4:
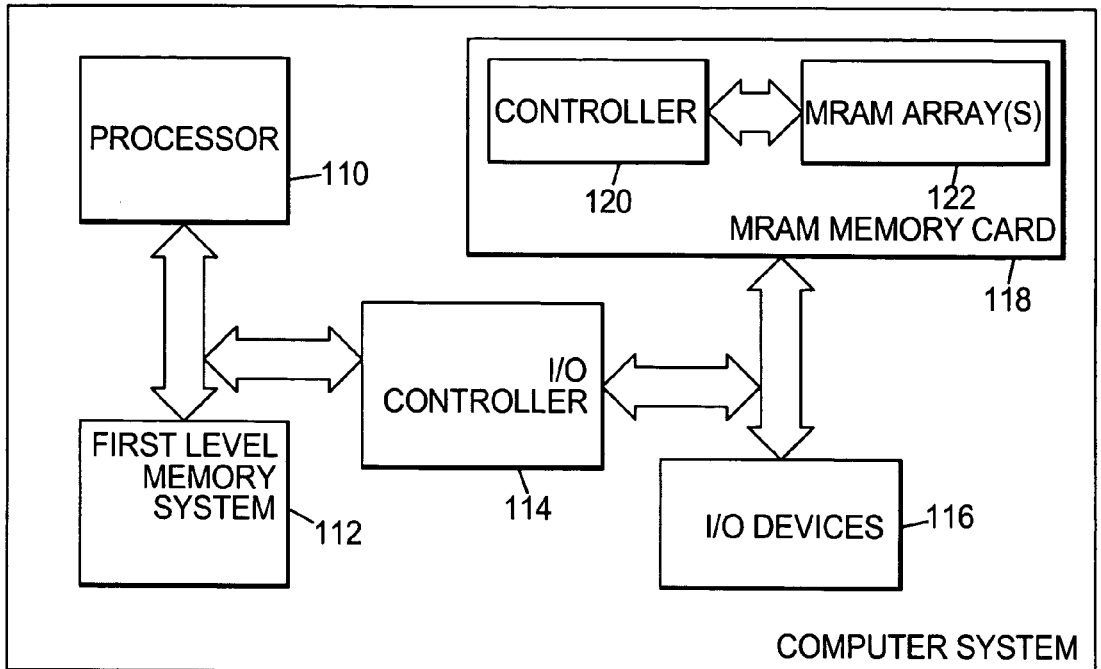
FIG. 4 is a diagram illustrating a first embodiment of a system that includes an MRAM memory card with an error management system.

FIG. 4 is a diagram illustrating a first embodiment of a computer system 100 that includes an MRAM memory card 118 with an error management system. System 100 includes a processor 110, a first level memory system 112, an input/output (I/O) controller 114, input/output (I/O) devices 116, and memory card 118. Memory card 118 includes a controller 120 coupled to one or more MRAM arrays 122.

System 100 is an example of a host device that operates in conjunction with memory card 118. System 100 may be any type of stationary or mobile information processing system configured to operate in conjunction with memory card 118. Examples of such a system include a desktop or laptop computer, a server computer, a personal digital assistant (PDA), digital camera, and a mobile telephone.

Processor 110 is configured to execute instructions stored in first level memory system 112 as well as instructions stored in other memory devices (not shown) accessible by computer system 100. Processor 110 communicates with I/O devices 116 and memory card 118 using I/O controller 114.

First level memory system 112 comprises one or more volatile or non-volatile memory devices such as DRAM, ROM, flash memory, and SDRAM.

Controller 114 includes various types of interfaces. These interfaces may include one or more of each of the following types of interfaces: IDE interfaces, ATA interfaces, SCSI interfaces, USB interfaces, USB 2.0 interfaces, IEEE 1394 interfaces, IEEE 1284 interfaces, RS232 interfaces, and CompactFlash interfaces, for example.

I/O devices 116 include any number of devices and may include one or more of each of the following example devices: hard disk drives, CD drives, DVD drives, user interface devices (e.g., a keyboard, a mouse, a touch pad, etc.), and external peripheral devices (e.g., a printer, a network device, a scanner, etc.).

Memory card 118 couples to any suitable interface in I/O controller 114. Memory card 118 stores information from processor 110 and/or I/O devices 116 in MRAM arrays 122 in response to write commands from processor 110 and/or I/O devices 116. Memory card 118 also provides information to processor 110 and/or I/O devices 116 in response to read commands from processor 110 and/or I/O devices 116.

Figure 5:
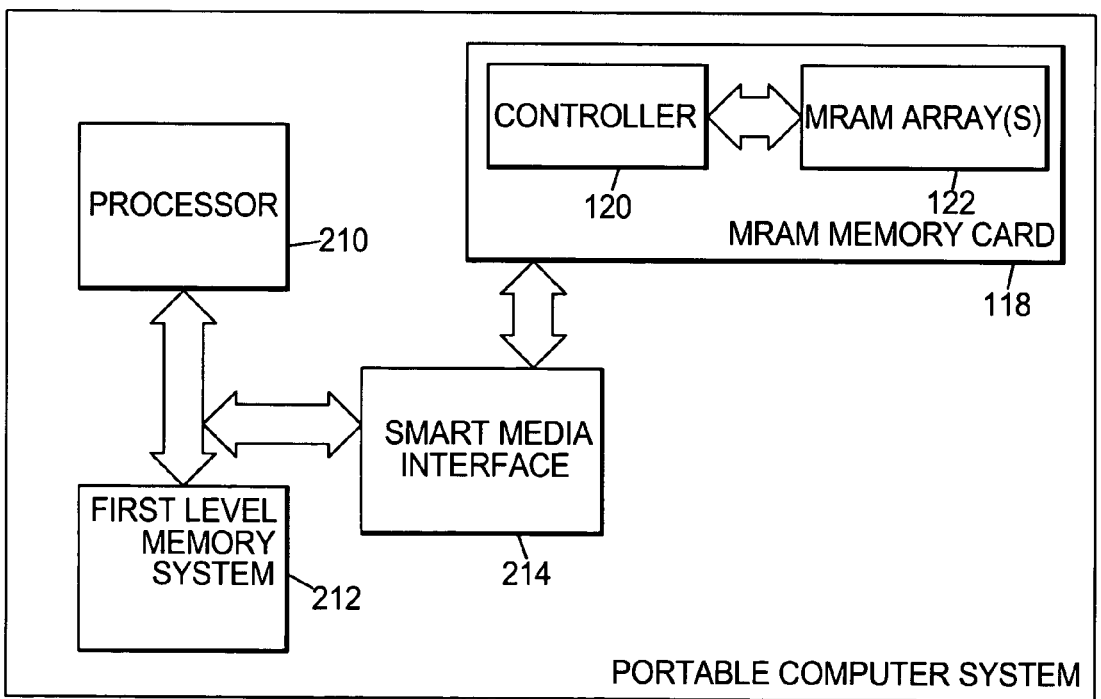
FIG. 5 is a diagram illustrating a second embodiment of a system that includes an MRAM memory card with an error management system.

FIG. 5 is a diagram illustrating a second embodiment of a portable computer system 200 that includes MRAM memory card 118. System 200 includes a processor 210, a first level memory system 212, a Smart Media interface 214, and memory card 118.

System 200 is an example of a host device that operates in conjunction with memory card 118. System 200 may be any type of portable or mobile information processing system configured to operate in conjunction with memory card 118. Examples of such a system include a laptop computer, a personal digital assistant (PDA), an MP3 player, a digital audio or video recorder, and a mobile telephone.

Processor 210 is configured to execute instructions stored in first level memory system 212 as well as instructions stored in other memory devices (not shown) accessible by computer system 200. Processor 210 communicates with memory card 118 using Smart Media interface 214.

First level memory system 212 comprises one or more volatile or non-volatile memory devices such as DRAM, ROM, flash memory, and SDRAM.

Smart Media interface 214 implements the mechanical, electrical, and protocol attributes defined by the Smart Media interface specification(s). In other embodiments, Smart Media interface 214 may be replaced by a Compact-Flash, a Secure Digital, or a Memory Stick interface that implements the mechanical, electrical, and protocol attributes defined by the respective interface specification(s).

Memory card 118 couples to Smart Media interface 214. Memory card 118 stores information from processor 210 in MRAM arrays 122 in response to write commands from processor 110. Memory card 118 also provides information to processor 110 in response to read commands from processor 110.

Figure 6:
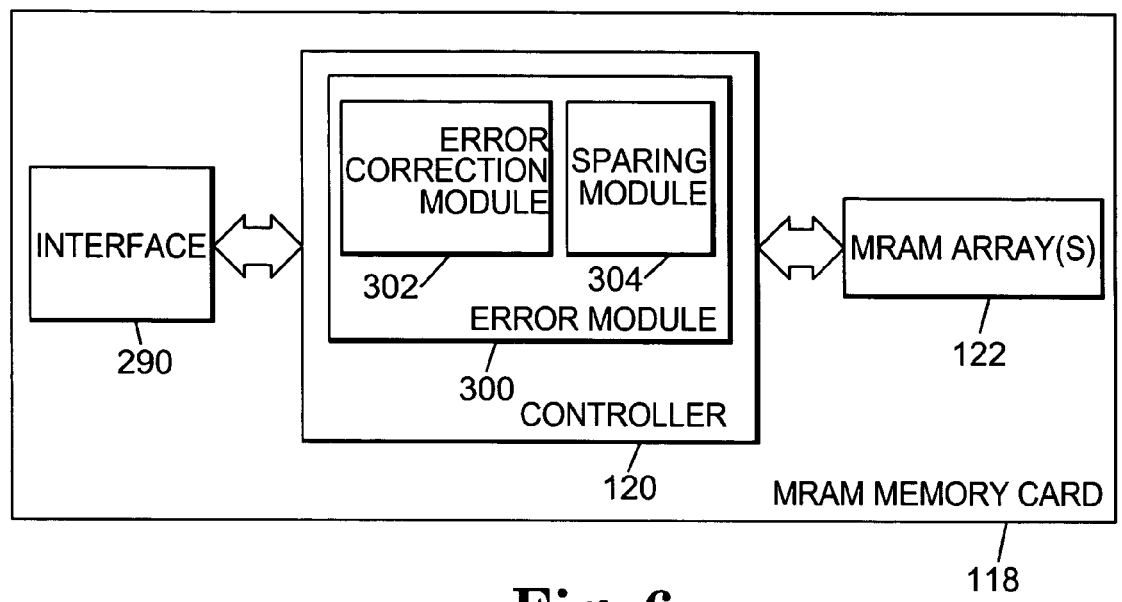
FIG. 6 is a diagram illustrating an embodiment of an MRAM memory card with an error management system.

FIG. 6 is a diagram illustrating additional details of an embodiment of MRAM memory card 118. As shown in FIG. 6, memory card 118 includes an interface 290. Interface 290 may be a CompactFlash interface, an IDE interface, an ATA interface, a SCSI interface, an USB interface, an USB 2.0 interface, an IEEE 1394 interface, an IEEE 1284 interface, a RS232 interface, a Smart Media interface, a Secure Digital interface, a Memory Stick interface, or any other suitable interface.

Controller 120 may be a discrete controller separate from MRAM array 122 or may be integrated with MRAM array 122. Controller 120 includes an error module 300. Error module 300 comprises an error management system that includes error correction module 302 and sparing module 304.

MRAM arrays 122 generally have persistent errors in memory cells 12 throughout the array. These errors include shorted bits, open bits, and half-select bits as well as isolated defective bits and random errors.

Shorted bits result from abnormally low resistance in a memory cell 12. A shorted bit may be caused by metal-to-metal contact between a row and column of array 122, by imperfections in tunneling layer 51, or by the presence of large foreign particles. A shorted bit may cause malfunction of all memory cells 12 in the same row or column as the shorted bit.

Open bits result from abnormally high resistance in a memory cell 12. An open bit may cause an abnormally high resistance at all memory cells 12 in the same row or column as the open bit.

Half-select bits occur when a memory cell 12 changes its state in response to an access to another memory cell 12 in the same column and one or more specific different rows as the affected memory cell 12.

Isolated defective bits may occur for any reason other than the three reasons just discussed. Random errors occur in response to an incorrect determination of a data value in a memory cell 12 during a read of the memory cell 12.

Controller 120 is configured to perform error correction functions using error module 300 to counteract the effects of errors present in MRAM array 10. The error correction functions are performed by error correction module 302 and sparing module 304.

Errors detected during normal operation of memory card 118 are handled by error correction module 302. Error correction module 302 includes a symbol-based error correction code (ECC). In one embodiment, error correction module 302 includes Reed-Solomon encoder and decoder devices. Since error information for certain failure modes can be known prior to device operation, erasure encoding can be implemented into the Reed-Solomon decoder device. Erasure encoding may double the correction power for a given error correction code. Errors on an individual device address may be avoided using a progressive scheme of address incrementation. In particular, error correction module 32 may include a Reed-Solomon code with 32 bytes of redundancy for every 128 bytes of information. In other embodiments, other types of ECC may be included in error module. The combined original data and its associated redundancy information will be referred to here out as "error information".

In response to storing information in MRAM array 122 associated with a write command from a host device, error correction module 302 generates redundancy information using the ECC and stores the redundancy information in MRAM array 122 along with the information associated with the write command. Error correction module 302 detects random errors in information stored in MRAM array 122 in response to subsequent reads of the information using its associated redundancy information. Error correction module 302 corrects any errors it detects using the error information and notifies sparing module 304 of any defective memory cells it detects.

Memory cells 12 that are affected by a shorted or open bit are recognized during a read by abnormally low or high resistance values, respectively. In response to recognizing a shorted or open bit, error correction module 302 causes the symbols that contain one or more of the affected memory cells 12 to be marked as erasures prior to decoding. In this way, the error-correcting capability of error correction module 302 may be enhanced because for every full error (i.e., both the memory cell 12 position and value are unknown) that could be corrected, two erasures (i.e., the memory cell 12 position is known but the value is unknown) can instead be corrected.

In addition, error correction module 302 implements data layout algorithms to store the redundancy information generated by ECC in memory cells 12 within array 10 such that the possibility that defects may affect more than one stored code symbol is minimized. For example, error correction module 302 may cause redundancy information to be stored in memory cells 12 such that each bit of the information is stored in a different row and/or column as other bits in the redundancy information. Accordingly, the redundancy information may be restored if an entire row or column becomes defective.

A threshold for the number of errors which will be allowed in an operation on a memory block of MRAM is predetermined to be N. If more than N Errors are detected during testing of a given block of memory in memory card 118, they are handled by a sparing module 304. The sparing module 304 includes a sparing algorithm and table to maintain a list of memory cells 12 that are determined to be defective during testing. Sparing module 304 ensures that defective memory cells 12 are not used during normal operation of memory card 118. When the number of errors in a given block exceed N during normal operation, the sparing module 304 includes the defective memory cell 12 in the sparing table to prevent the memory cell from being used again. For example, sparing module 304 can be configured to implement sector sparing, row sparing, and/or column sparing.

Figure 7:
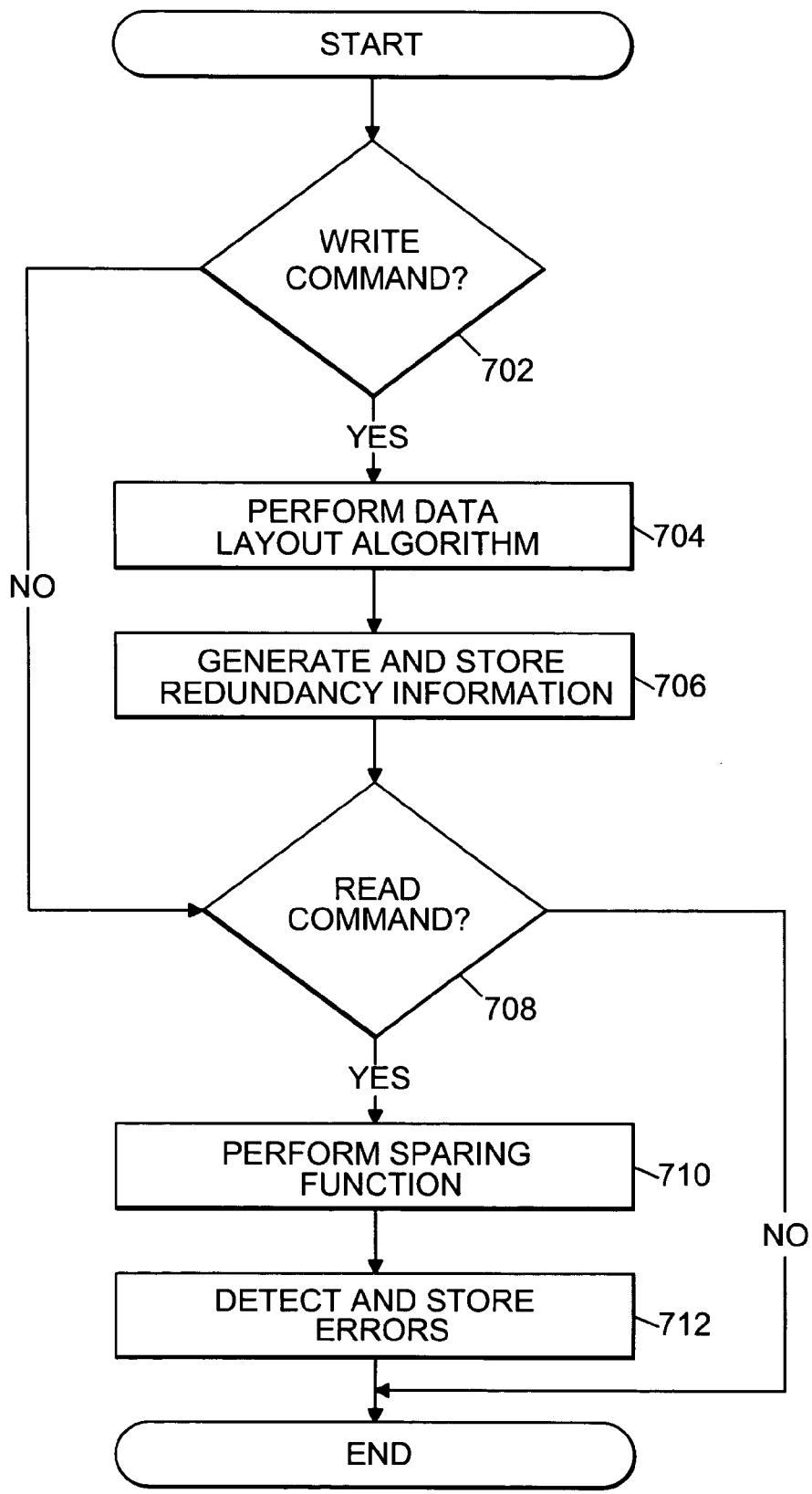
FIG. 7 is a flow chart illustrating an embodiment of a method for managing errors in an MRAM memory card.

The operation of error correction module 302 and sparing module 304 are illustrated during normal operation of memory card 118 with reference to FIG. 7. During normal operation, memory card 118 receives data transfer commands from a host device. These data transfer commands include read commands and write commands. FIG. 7 is a flow chart illustrating an embodiment of a method for managing errors in MRAM memory card 118.

In FIG. 7, a determination is made as to whether a write command is detected as indicated in a block 702. If a write command is not detected, then the method continues at block 708. If a write command is detected, then error correction module 302 performs a data layout algorithm function on the information to be written as indicated in a block 704. By performing the data layout algorithm function, error correction module 302 determines one or more locations in array 10 where the information may be stored to maximize the possibility of reliably reading back the information. Error correction module 302 also generates and stores redundancy information generated by the ECC as indicated in a block 706. Error correction module 302 may perform a data layout algorithm function for the redundancy information prior to storing the redundancy information.

A determination is made as to whether a read command is detected as indicated in a block 708. If a read command is not detected, then the method ends. If a read command is detected, then a sparing function is performed by sparing module 304 as indicated in a block 710. In response to the information being read from the MRAM array 122, sparing module 304 performs the sparing algorithm and accesses the sparing table to ensure that the information is reliably read.

In addition, the error correction module 302 detects errors and causes the errors to be stored by sparing module 304 as indicated in a block 712. Error correction module 302 corrects any errors using the ECC and the redundancy information associated with the read information prior to providing the read information to a host device. Sparing module 304 ensures that defective memory cells identified by error correction module 302 are not re-used by subsequent writes.

In the embodiment of FIG. 6, error correction module 302 and sparing module 304 may be implemented using any combination of hardware and software.

What is claimed is:

1. A memory card comprising:
a magnetic random access memory (MRAM) array that comprises a plurality of magnetic memory cells; and
a controller coupled to the MRAM array;
wherein the controller is configured to communicate with a host device, and wherein the controller is configured to perform an error correction function associated with at least one of the plurality of magnetic memory cells.

2. The memory card of claim 1 wherein the controller comprises an error correction module, and wherein the error correction module is configured to perform the error correction function.

3. The memory card of claim 2 wherein the error correction module comprises Reed-Solomon encoding and decoding devices.

4. The memory card of claim 3 wherein erasure encoding is implemented into the Reed-Solomon decoding device.

5. The memory card of claim 2 wherein the error correction module is configured to perform a data layout algorithm.

6. The memory card of claim 1 wherein the controller comprises a sparing module, and wherein the sparing module is configured to perform the error correction function.

7. The memory card of claim 6 wherein the sparing module is configured to implement sector sparing.

8. The memory card of claim 1 wherein the controller is configured to perform the error correction function in response to a write operation.

9. The memory card of claim 1 wherein the controller is configured to perform the error correction function in response to a read operation.

10. A system comprising:
a host device; and
a memory card coupled to the host device, the memory card comprising a magnetic random access memory (MRAM) array that comprises a magnetic memory cell and a controller coupled to the MRAM array;
wherein the controller comprises an error correction module and a sparing module, and wherein the controller is configured to cause error correction functions to be performed using the error correction module and the sparing module.

11. The system of claim 10 wherein the host device comprises an input/output (I/O) controller that comprises a first interface and a second interface that differs from the first interface, wherein the memory card comprises a third interface, and wherein the third interface is coupled to the first interface.

12. The system of claim 10 wherein the host device comprises a first Smart Media interface, wherein the memory card comprises a second Smart Media interface, and wherein the memory card is coupled to the host device using the first and second Smart Media interfaces.

13. The system of claim 10 wherein the error correction module comprises Reed-Solomon encoding and decoding devices.

14. The system of claim 13 wherein erasure encoding is implemented into the Reed-Solomon decoding device.

15. The system of claim 10 wherein the sparing module is configured to implement sector sparing.

16. The system of claim 10 wherein the sparing module is configured to implement row sparing.

17. The system of claim 10 wherein the sparing module is configured to implement column sparing.

18. A method performed by a memory card that comprises a controller and a magnetic random access memory (MRAM) array coupled to the controller comprising:
detecting a data transfer command associated with at least one magnetic memory cell in the MRAM array from a host device; and
performing an error correction function associated with the data transfer command.

19. The method of claim 18 further comprising:
performing the error correction function using an error correction module in response to the data transfer command being a write command.

20. The method of claim 18 further comprising:
performing the error correction function using a sparing module in response to the data transfer command being a read command.

21. A memory card comprising:
a magnetic random access memory (MRAM) array that comprises a plurality of magnetic memory cells; and
a controller coupled to the MRAM array;
wherein the controller is configured to communicate with a host device, and wherein the controller comprises a means for performing an error correction function associated with at least one of the plurality of magnetic memory cells.

22. The memory card of claim 21 wherein the means is for performing the error correction function in response to a write operation.

23. The memory card of claim 21 wherein the means is for performing the error correction function in response to a read operation.

24. The memory card of claim 1 wherein each of the plurality of magnetic memory cells includes a first layer of magnetic film with an alterable direction of magnetization and a second layer of magnetic film with a fixed direction of magnetization.

* * * * *